United States Patent
Todaka

(10) Patent No.: US 7,183,827 B2
(45) Date of Patent: Feb. 27, 2007

(54) MIXING PREVENTION CIRCUIT FOR PREVENTING MIXING OF SEMICONDUCTOR CHIPS AND SEMICONDUCTOR CHIP DISCRIMINATION METHOD

(75) Inventor: Junichi Todaka, Oita (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/346,272

(22) Filed: Feb. 3, 2006

(65) Prior Publication Data

US 2006/0125540 A1 Jun. 15, 2006

Related U.S. Application Data

(62) Division of application No. 10/864,467, filed on Jun. 10, 2004, now Pat. No. 7,019,575.

(30) Foreign Application Priority Data

Jun. 11, 2003 (JP) ............................. 2003-166853

(51) Int. Cl.
*H03K 3/286* (2006.01)
*H03K 17/687* (2006.01)

(52) U.S. Cl. ...................... 327/215; 327/603
(58) Field of Classification Search ................ 327/215, 327/603
See application file for complete search history.

(56) References Cited

U.S. PATENT DOCUMENTS 5,541,536 A 7/1996 Rajivan ........................ 326/98
6,515,532 B2 * 2/2003 Jinzai .......................... 327/333
6,870,412 B2 3/2005 Cho ............................. 327/202

FOREIGN PATENT DOCUMENTS

JP 64-84637 3/1989

OTHER PUBLICATIONS

Toshiba Corp. Semiconductor Co., p. 83, "Toshiba Very High Speed C²MOS TC74VCH-VHCT Series Data Book", 1999.
Toshiba Corp. Semiconductor Co., p. 871, "Low Voltage C²MOS Logic TC74VCX/LCX/LVX Series Data Book", 2001.

* cited by examiner

*Primary Examiner*—Kenneth B. Wells
(74) *Attorney, Agent, or Firm*—Oblon, Spivak, McClelland, Maier & Neustadt, P.C.

(57) ABSTRACT

First, second, and third inverters are connected in series. An output of the third inverter is supplied to the gates of first pMOS and nMOS. An output of the first inverter is supplied to the gate of the second nMOS and the drain of the second nMOS is connected to the source of the first nMOS. The drains of the second pMOS, third nMOS are supplied with the output of the first inverter and the gates thereof are supplied with the output of the third inverter. The gate of the third pMOS is connected to the drains of the first nMOS and pMOS and the drain thereof is connected to the source of the second pMOS. The gate of the fourth nMOS is connected to the drains of the first nMOS and pMOS and the drain thereof is connected to the source of the third nMOS.

5 Claims, 3 Drawing Sheets

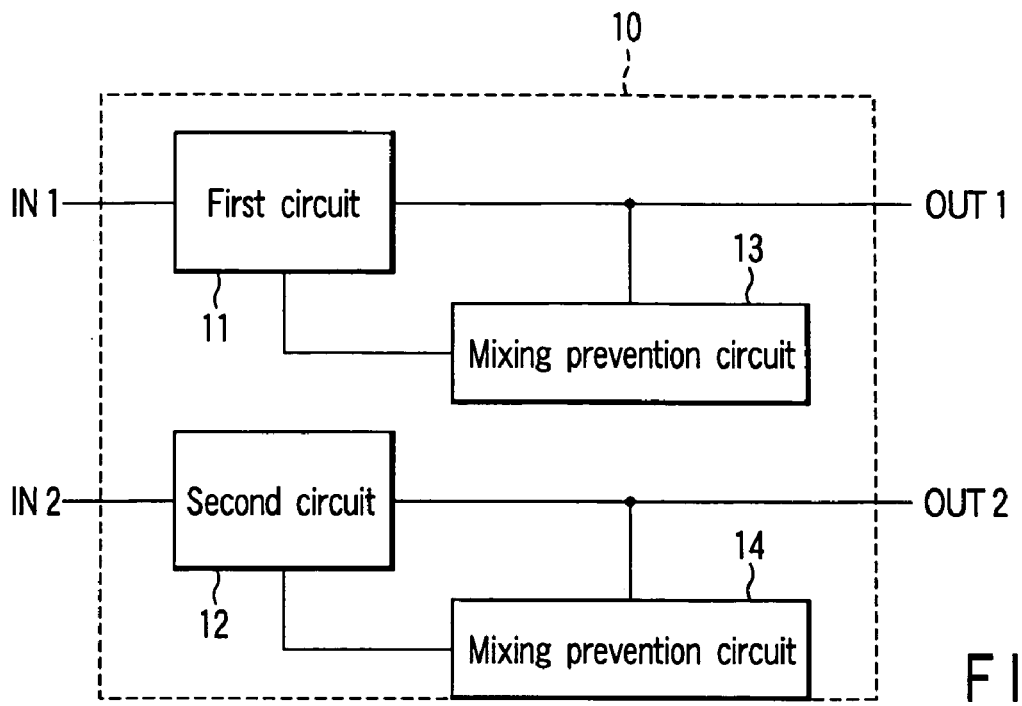
F I G. 4
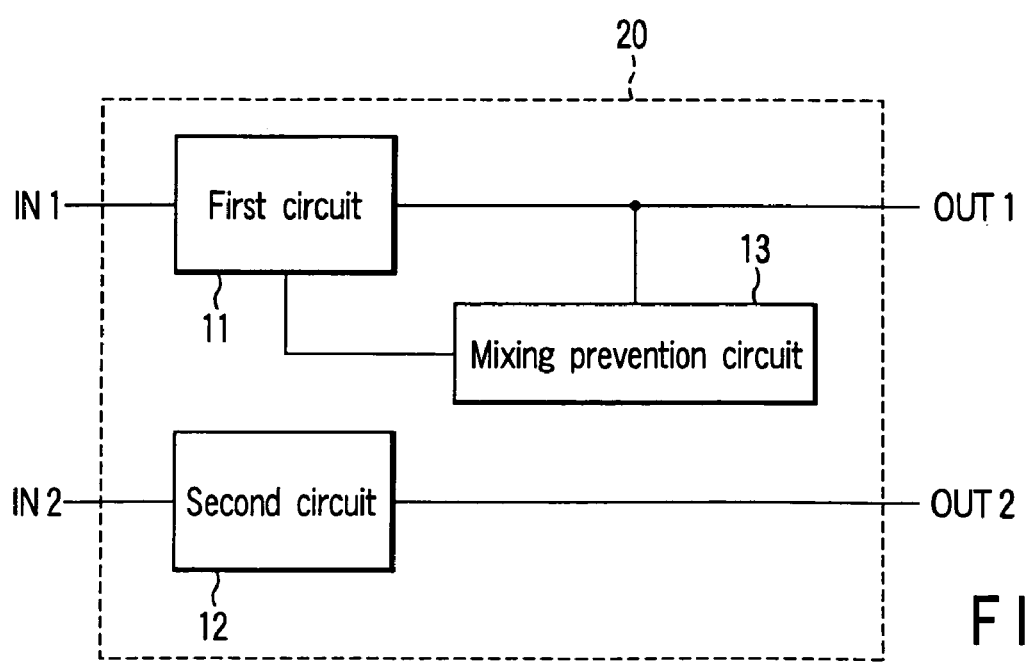
F I G. 5

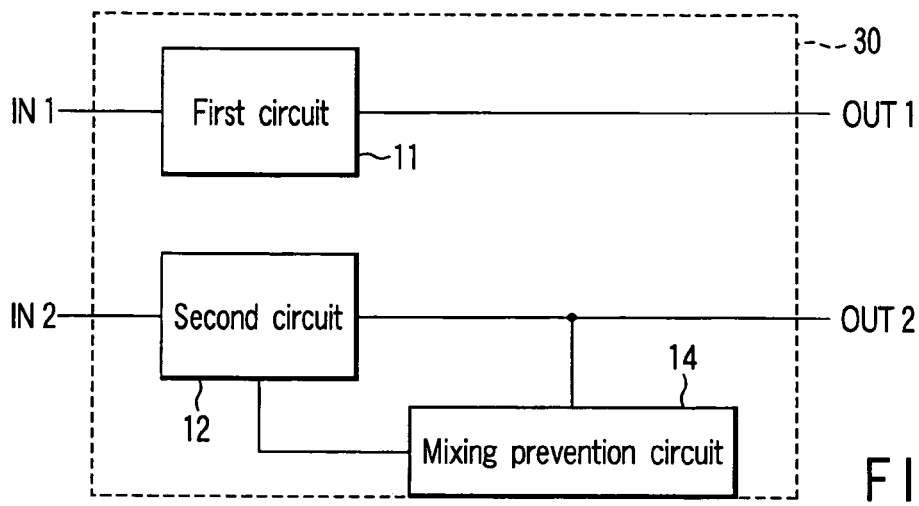
FIG. 6
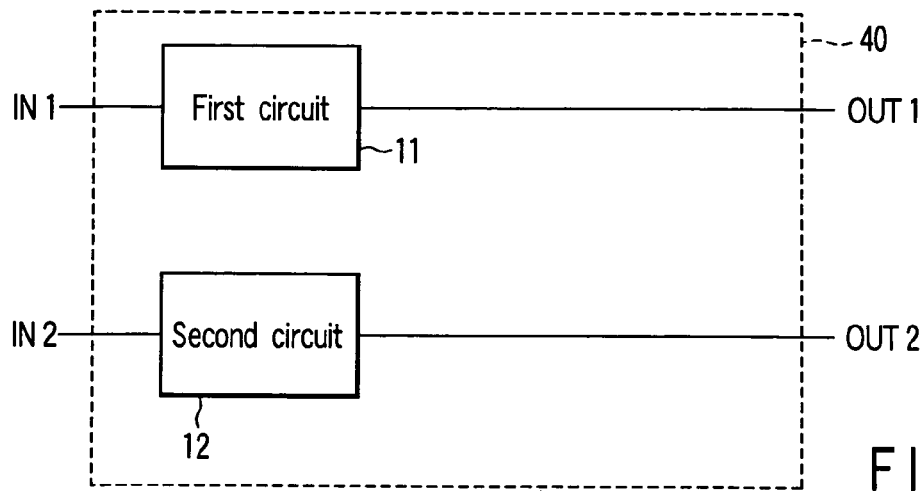
FIG. 7
| OUT 1 | OUT 2 | Chip discrimination |
|---|---|---|
| 1 | 1 | Normal chip |
| 1 | 0 | First mixed chip |
| 0 | 1 | Second mixed chip |
| 0 | 0 | Third mixed chip |
FIG. 8

MIXING PREVENTION CIRCUIT FOR PREVENTING MIXING OF SEMICONDUCTOR CHIPS AND SEMICONDUCTOR CHIP DISCRIMINATION METHOD

CROSS-REFERENCE TO RELATED APPLICATIONS

This application is a divisional of U.S. application Ser. No. 10/864,467, filed Jun. 10, 2004, now U.S. Pat. No. 7,019,575 and is based upon and claims the benefit of priority from prior Japanese Patent Application No. 2003-166853, filed Jun. 11, 2003, the entire contents of each of which are incorporated herein by reference.

BACKGROUND OF THE INVENTION

1. Field of the Invention

This invention relates to a mixing prevention circuit which prevents mixing of different semiconductor chips and is used to discriminate a semiconductor chip and a semiconductor chip discrimination method using the mixing prevention circuit.

2. Description of the Related Art

In a process for manufacturing a large-scale semiconductor integrated circuit (which is hereinafter referred to as an LSI), a wafer which has been subjected to a wafer measurement/evaluation process called a die sort test is divided into individual chips in a dicing step. After this, only chips of good quality are set into respective packages in an assembly step.

At this time, chips of different products may sometimes be mixed in a manufacturing process in which chips of normal products (which are hereinafter referred to as normal chips) flow. If the chips thus mixed. (which are hereinafter referred to as mixed chips) are packaged, it becomes difficult to make chip discrimination based on the functions thereof until the final test in a case where normal chips and mixed chips are products with the same function such as general logic products. Therefore, there will occur a problem that different chips are shipped and defects occur in the market.

In the conventional mixing prevention method, normal chips and mixed chips are discriminated based on a difference between the electrical characteristics which can be used in the normal chip and mixed chip by use of a mixing prevention circuit as will be described below. One example of the conventional mixing prevention circuit formed in the chip is shown in FIG. 3 (for example, refer to "TOSHIBA Very High Speed C²MOS TC74VHC-VHCT Series Data Book 1999", TOSHIBA Corp. Semiconductor Co. p. 83 or "Low Voltage C²MOS Logic TC74VCX/LCX/LVX Series Data Book 2001", TOSHIBA Corp. Semiconductor Co. p. 871).

Assume that an input signal IN is input to an input terminal TI of the mixing prevention circuit and an output signal OUT is output from an output terminal TO. The mixing prevention circuit is an inverter circuit configured by a first-stage inverter, second-stage inverter and buffer section. The first-stage inverter is configured by transistors TR1, TR2 and supplied with the input signal IN. The second-stage inverter is configured by transistors TR3, TR4 and supplied with an output of the first-stage inverter. The buffer section is configured by transistors TR5, TR6 and supplied with an output of the second-stage inverter.

A "Vin-ICC' method" is explained below as one example of the conventional mixing prevention method using the mixing prevention circuit.

A D.C. voltage which changes from ground potential GND to power supply voltage VDD is applied to the input terminal TI after preset power supply voltage VDD is applied to the inverter circuit. Then, the transistors TR1, TR2 configuring the first-stage inverter are both set into the ON state so as to permit a penetration current ICC' to flow from the power supply voltage node VDD to the ground potential node GND via the transistors TR1, TR2. At this time, voltage applied to the input terminal TI is used as input application voltage.

Since a value of the penetration current ICC' varies according to the input application voltage value, an input application voltage value is set so that penetration currents ICC' will not be set to the same value in a permissible process fluctuation range between normal chips and mixed chips by using the penetration current ICC' as an available electrical characteristic difference. With the thus set input application voltage value, since a difference always occurs between the penetration currents ICC' of the normal chips and mixed chips, discrimination between the normal chip and the mixed chip can be made by applying the input application voltage and measuring the penetration current ICC'.

However, since the value of the penetration current ICC' is controlled by setting the transistor size of the first-stage inverter in the conventional mixing prevention method, the following problems (1), (2) occur.

(1) When the transistor size of the first-stage inverter is set small, the switching speed is lowered.

(2) When the transistor size of the first-stage inverter is set large, CPD (Power Dissipation Capacitance) is deteriorated.

The above problems (1), (2) will be a cause of deterioration of the product characteristics.

Further, in the conventional mixing prevention method described above, it becomes difficult to detect the electrical characteristic difference because of a process fluctuation such as a variation in the manufacturing process. In addition, it is predicted that the number of products with the same function will increase with shrinkage or a lowering in the voltage, and therefore; it becomes difficult to discriminate semiconductor chips.

BRIEF SUMMARY OF THE INVENTION

A mixing prevention circuit according to an aspect of the present invention comprises a first inverter circuit; a second inverter circuit having an input portion supplied with an output of the first inverter circuit; a third inverter circuit having an input portion supplied with an output of the second inverter circuit; a first p-channel MOS transistor and first n-channel MOS transistor whose gates are supplied with an output of the third inverter circuit and whose drains are connected together; a second n-channel MOS transistor having a gate supplied with the output of the first inverter circuit and a drain connected to a source of the first n-channel MOS transistor; a second p-channel MOS transistor and third n-channel MOS transistor whose drains are supplied with the output of the first inverter circuit and whose gates are supplied with the output of the third inverter circuit; a third p-channel MOS transistor having a gate connected to the drains of the first p-channel MOS transistor and first n-channel MOS transistor and a drain connected to a source of the second p-channel MOS transistor; and a fourth n-channel MOS transistor having a gate connected to the drains of the first p-channel MOS transistor and first n-channel MOS transistor and a drain connected to a source of the third n-channel MOS transistor.

A semiconductor chip discrimination method according to another aspect of the present invention comprises detecting the presence or absence of a penetration current occurring in a preset circuit in a first semiconductor chip which contains a mixing prevention circuit connected to the preset circuit, the mixing prevention circuit generating a penetration current when voltage is applied to the preset circuit; and detecting the presence or absence of a penetration current occurring in a preset circuit in a second semiconductor chip which does not contain a mixing prevention circuit connected to the preset circuit.

A semiconductor chip discrimination method according to a further aspect of the present invention which is a method for discriminating a plurality of semiconductor chips each of which includes first and second circuits comprises detecting the presence or absence of a penetration current occurring in each of the first and second circuits in a first semiconductor chip which contains a first mixing prevention circuit connected to the first circuit and a second mixing prevention circuit connected to the second circuit, the first and second mixing prevention circuits generating penetration currents when voltages are applied to the first and second circuits; detecting the presence or absence of a penetration current occurring in each of the first and second circuits in a second semiconductor chip which contains a first mixing prevention circuit connected to the first circuit and does not contain a second mixing prevention circuit connected to the second circuit; and detecting the presence or absence of a penetration current occurring in each of the first and second circuits in a third semiconductor chip which contains none of first and second mixing prevention circuits respectively connected to the first and second circuits.

BRIEF DESCRIPTION OF THE SEVERAL VIEWS OF THE DRAWING

FIGS. 4 to 7 are block diagrams showing the circuit configurations of a semiconductor chip having two circuits according to a third embodiment of this invention; and FIG. 8 is a diagram showing the discrimination state of chips based on output signals OUT1, OUT2.

DETAILED DESCRIPTION OF THE INVENTION

There will now be described embodiments of this invention with reference to the accompanying drawings. In this explanation, common reference symbols are attached to like portions throughout the drawings.

First Embodiment

First, a mixing prevention circuit according to a first embodiment of this invention is explained.

Figure 2:
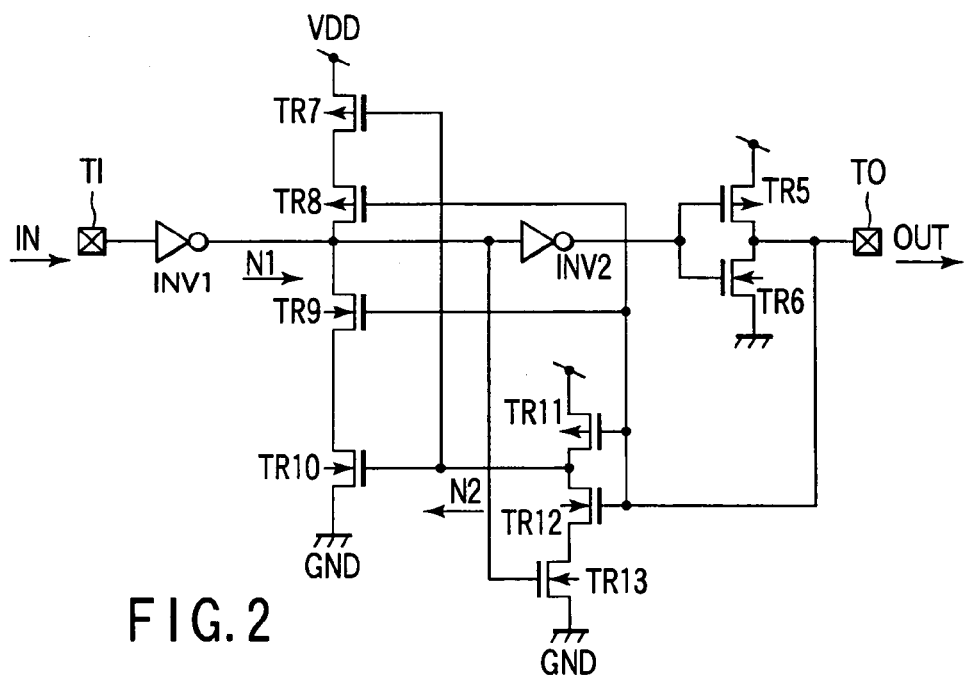
FIG. 2 is a circuit diagram showing the configuration of a mixing prevention circuit according to a first embodiment of this invention.

FIG. 2 is a circuit diagram showing the configuration of the mixing prevention circuit according to the first embodiment.

Figure 1:
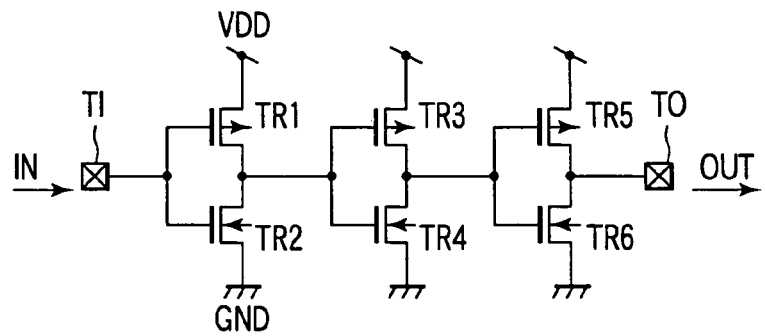
FIG. 1 is a circuit diagram showing the configuration of the conventional mixing prevention circuit.

Assume that an input signal IN is input to an input terminal TI of the mixing prevention circuit and an output signal OUT is output from an output terminal TO as shown in FIG. 2. The mixing prevention circuit includes an inverter circuit configured by a first-stage inverter INV1, second-stage inverter INV2 and buffer section (inverter) INV3. Like the conventional circuit shown in FIG. 1, the first-stage inverter INV1 is configured by a p-channel MOS transistor (which is hereinafter referred to as a pMOS transistor) TR1 and n-channel MOS transistor (which is hereinafter referred to as an nMOS transistor) TR2 (not shown). Likewise, the second-stage inverter INV2 is configured by a pMOS transistor TR3 and nMOS transistor TR4 and the buffer section INV3 is configured by a pMOS transistor TR5 and nMOS transistor TR6.

The drains of a pMOS transistor TR11 and nMOS transistor TR12 whose gates are both supplied with the output signal OUT are connected together. A signal N2 is output from the commonly connected drains. The source of the pMOS transistor TR11 is connected to a power supply voltage node VDD.

The drain of an nMOS transistor TR13 whose gate is supplied with a signal N1 output from the first-stage inverter INV1 is connected to the source of the nMOS transistor TR12 and the source thereof is connected to a reference potential node or a ground potential node GND in this example.

The gates of a pMOS transistor TR8 and nMOS transistor TR9 whose drains are both supplied with the signal N1 are both supplied with the output signal OUT.

The drain of a pMOS transistor TR7 whose gate is supplied with the signal N2 output from the drains of the pMOS transistor TR11 and nMOS transistor TR12 is connected to the source of the pMOS transistor TR8 and the source thereof is connected to the power supply voltage node VDD.

The drain of an nMOS transistor TR10 whose gate is supplied with the signal N2 is connected to the source of the nMOS transistor TR9 and the source thereof is connected to the ground potential node GND.

Next, the operation of the mixing prevention circuit according to the first embodiment is explained for each case of (1) mixing prevention operation and (2) normal operation.

(1) Mixing Prevention Operation

When a low-level signal (which is hereinafter indicated by "L"), for example, reference potential such as ground potential GND is input to the input terminal TI as an input signal IN, the mixing prevention operation is started. By inputting "L" as the input signal IN, the signal N1 is set to a high-level signal (which is hereinafter indicated by "H"), for example, power supply voltage and "H" is output as an output signal OUT from the output terminal TO.

The pMOS transistor TR11 is set into the "OFF" state when "H" of the output signal OUT is input to the gate thereof and the nMOS transistor TR12 is set into the "ON" state when "H" of the output signal OUT is input to the gate thereof. Further, the nMOS transistor TR13 is set into the "ON" state when "H" of the signal N1 is input to the gate thereof and the signal N2 is set to "L".

The pMOS transistor TR8 is set into the "OFF" state when "H" of the output signal OUT is input to the gate thereof and the nMOS transistor TR9 is set into the "ON" state when "H" of the output signal OUT is input to the gate thereof. Further, the pMOS transistor TR7 is set into the "ON" state when "L" of the signal N2 is input to the gate thereof and the nMOS transistor TR10 is set into the "OFF" state when "L" of the signal N2 is input to the gate thereof. In this case, since the potentials of the internal signals N1, N2 are statically set, a penetration current ICC' does not flow from the power supply voltage node VDD to the ground potential node GND.

Next, if a D.C. voltage which changes from the power supply voltage VDD to the ground potential GND is applied to the output terminal TO, the pMOS transistor TR11 is set into the ON state when the applied voltage is set approximately equal to a value which is dropped by the threshold voltage Vth of the pMOS transistor TR11. At this time, since the nMOS transistors TR12, TR13 are both set in the ON state, a penetration current ICC' starts to flow from the power supply voltage node VDD to the ground potential node GND through the transistors TR11, TR12, TR13.

If the voltage applied to the output terminal TO is further lowered, the gate voltage of the nMOS transistor TR12 becomes lower than the threshold voltage Vth and the nMOS transistor TR12 is soon set into the "cutoff" state. As a result, a penetration current ICC' does not flow from the power supply voltage node VDD to the ground potential node GND through the transistors TR11, TR12, TR13.

The pMOS transistor TR11 and nMOS transistors TR12, TR13 configure a penetration current (ICC') detecting circuit section. Only when the input signal IN is "L", the signal N1 becomes "H" and the nMOS transistor TR13 is set into the ON state. Thus, a selection signal which sets the mixing prevention operation mode is attained by inputting "L" to the input terminal TI as the input signal IN.

In a case where a fault or failure occurs in the penetration current detecting circuit section, that is, when the potential level of the signal N2 is randomly set to "L" or "H" while the pMOS transistor TR11 and nMOS transistors TR12, TR13 are set in the OFF state, no penetration current ICC' flows even if the mixing prevention operation mode is selected. Thus, there occurs a problem that discrimination between normal chips and mixed chips cannot be made.

Therefore, the operation state of the penetration current detecting circuit section is detected by use of a fault detecting circuit section configured by the pMOS transistors TR7, TR8 and nMOS transistors TR9, TR10 and a chip is discarded as a faulty chip when the fault is detected.

(a) When the signal N2 is set at "L", the pMOS transistors TR7, TR8 are both set into the ON state by inputting "H" to the input terminal TI as the input signal IN. Therefore, a standby current ICC flows through a passage of power supply voltage node VDD→TR7→TR8→signal line N1→TR2 in INV1→ground potential node GND.

(b) When the signal N2 is set to "H", the nMOS transistors TR9, TR10 are both set into the ON state by inputting "L" to the input terminal TI as the input signal IN. Therefore, a standby current ICC flows through a passage of power supply voltage node VDD→TR1 in INV1→signal line N1→TR9→TR10→ground potential node GND.

When a fault occurs in the penetration current detecting circuit section as described in the-items (a) and (b), a standby current ICC is generated by inputting "L" or "H" as the input signal IN. As a result, a faulty chip can be detected by detecting the standby current ICC.

When the penetration current detecting circuit section is correctly operated, the output signal OUT and signal N2 are always set at complementary potential levels. Therefore, there occurs no possibility that the pMOS transistors TR7, TR8 connected between the power supply voltage node VDD and the signal line N1 are both set in the ON state.

Also, there occurs no possibility that the nMOS transistors TR9, TR10 connected between the ground potential node GND and the signal line N1 are both set in the ON state. Thus, the standby current ICC is not generated.

As described before, in the circuit of the present embodiment shown in FIG. 2, a penetration current can be generated in the chip by applying desired voltage to the output terminal TO after the input terminal process is performed (after "L" is input as the input signal IN). If the circuit as shown in the present embodiment is not provided, no penetration current is generated. Therefore, discrimination between normal chips and mixed chips can be made according to the presence or absence of the penetration current. More specifically, discrimination between normal chips and mixed chips can be made according to the presence or absence of the penetration current by forming the mixing prevention circuit shown in FIG. 2 on each of the normal chips and forming no mixing prevention circuit on the mixed chip.

However, in this case, the transistor TR5 of the buffer section is set in the ON state so as to permit a current IOH to flow from the power supply voltage node VDD toward the output terminal OUT. Therefore, it is necessary to select application voltage which is set as high as possible so as not to pass the large current IOH and causes the penetration current ICC' to be generated as voltage applied to the output terminal TO. Further, since the penetration current ICC' to be detected is not required to be a large current, it may be set to a small current.

Since the current passages for the current IOH and penetration current ICC' are different, no problem occurs when the penetration current is detected in the mixing prevention method described above.

(2) Normal Operation

Unless voltage is applied to the output terminal TO from the exterior, the mixing prevention operation is not performed and the normal operation is performed.

At the normal operation time, when an input signal IN of "L" or "H" is input to the input terminal TI, the potentials of the signal N1, output signal OUT and signal N2 are logically determined and the penetration current ICC' does not flow from the power supply voltage node VDD to the ground potential node GND via the transistors TR11, TR12, TR13.

Further, in the operation transition period in which the input signal IN is changed from "L" to "H" or "H" to "L", the output signal OUT and signal N2 are always set at complementary potential levels. Therefore, there occurs no possibility that the pMOS transistors TR7, TR8 connected between the power supply voltage node VDD and the signal line N1 will both be set in the ON state. Also, there occurs no possibility that the nMOS transistors TR9, TR10 connected between ground potential node GND and the signal line N1 are will both be set in the ON state. Thus, an influence by the circuit of this embodiment on the operation transition period, that is, switching speed is extremely small.

In the mixing prevention circuit of the present embodiment, the size of the first-stage inverter is not required to be set to a size which is suitable for the mixing prevention method and the influence on the operation transition period is suppressed as described before. Therefore, deterioration in the product characteristic which is a problem in the conventional circuit can be suppressed.

Further, since discrimination of chips can be made based on the presence or absence of the penetration current, the electrical characteristic difference which is influenced by the process fluctuation such as a variation in the manufacturing process which causes a problem in the conventional mixing prevention method is not required.

Further, since the mixing prevention process can be performed by a pin process for desired input and output terminals, the mixing prevention method can be applied as a mixing prevention method for a plurality of products having the same function by allocating installation of the mixing prevention circuit of the present embodiment in a specified bit in the chip.

Second Embodiment

Next, a mixing prevention circuit according to a second embodiment of this invention is explained.

Figure 3:
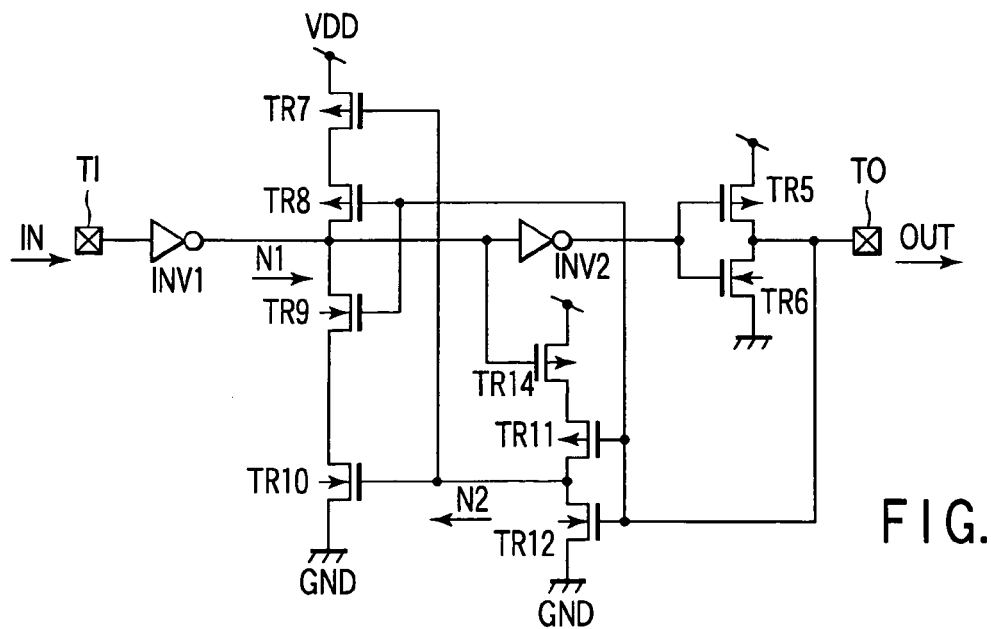
FIG. 3 is a circuit diagram showing the configuration of a mixing prevention circuit according to a second embodiment of this invention.

FIG. 3 is a circuit diagram showing the configuration of the mixing prevention circuit according to the second embodiment.

In the second embodiment, the mixing prevention operation can be performed by using a pMOS transistor TR14 instead of the nMOS transistor TR13 in the first embodiment shown in FIG. 2 and setting the signal IN input to the input terminal TI to "H", for example, power supply voltage VDD.

As shown in FIG. 3, the nMMOS transistor TR13 is removed in the circuit of FIG. 2 and the source of the nMMOS transistor TR12 is directly connected to the ground potential node GND. Further, the pMOS transistor TR14 is connected between the source of the pMOS transistor TR11 and the power supply voltage node VDD. The gate of the pMOS transistor TR14 is supplied with a signal N1.

With the above configuration, when the mixing prevention operation is performed, voltage applied to the output terminal OUT is changed from the ground potential GND to the power supply voltage VDD. In this respect, the operation of the second embodiment is different from the operation of the circuit shown in FIG. 2 and the other operation is basically the same as the operation of the circuit shown in FIG. 2.

Further, like the first embodiment, since the mixing prevention process can be performed by a pin process for desired input and output terminals, the mixing prevention method can be applied as a mixing prevention method for a plurality of products having the same function by allocating installation of the mixing prevention circuit of the present embodiment in a specified bit in the chip. In a third embodiment described below, an example in which the mixing prevention circuit according to the first or second embodiment is mounted on each of a plurality of products having the same function to prevent mixing of a plurality of chips is explained.

Third Embodiment

In the third embodiment, a method for discriminating a plurality of semiconductor chips having the same function by mounting a mixing prevention circuit according to the first or second embodiment on a semiconductor chip.

When a circuit which is supplied with a signal, processes the signal and outputs the signal is dealt with as one circuit in a chip, the number of types of the chips which can be discriminated is determined based on the number of circuits (which is hereinafter referred to as a bit number) mounted on one chip. The number N of types of the chips which can be discriminated becomes equal to "$N=2^m$" according to the relation between two bits indicating whether or not the mixing prevention circuit is installed and the bit number. In this case, m indicates the bit number.

For example, in a general logic integrated circuit in which various types of products having the same function are provided, product groups are provided in which the bit number is set to 2 or 4, 6, 8, 16, 20. The number of types of the chips which can be discriminated is set to "$2^2$" when the bit number is 2, "$2^4$" when the bit number is 4, "$2^6$" when the bit number is 6, "$2^8$" when the bit number is 8, "$2^{16}$" when the bit number is 16, and "$2^{20}$" when the bit number is 20.

If a bit (circuit) in which the mixing prevention circuit is installed is previously allocated for products having the same function, discrimination between normal chips and mixed chips other than the normal chips can be made by making tests for all of the bits in the chip to determine the presence or absence of a penetration current generated by the mixing prevention circuit.

A discrimination method for a chip in which the bit number is 2 (the number of circuits is 2) is explained below. FIGS. 4 to 7 are block diagrams each showing the circuit configuration of a chip in which the bit number is 2 (the number of circuits is 2).

Four states are previously set according to, whether or not a mixing prevention circuit is installed on a normal chip 10, first mixed chip 20, second mixed chip 30 and third mixed chip 40.

The normal chip 10, first mixed chip 20, second mixed chip 30 and third mixed chip 40 each have a first circuit 11 and second circuit 12. An input signal IN1 is input to the first circuit 11 and an output signal OUT1 is output from the first circuit 11. Further, an input signal IN2 is input to the second circuit 12 and an output signal OUT2 is output from the second circuit 12.

As shown in FIG. 4, mixing prevention circuits 13, 14 are respectively connected to the first circuit 11 and second circuit 12 in the normal chip 10. Further, as shown in FIG. 5, a mixing prevention circuit 13 is connected to the first circuit 11 in the first mixed chip 20 and no mixing prevention circuit is connected to the second circuit 12. As shown in FIG. 6, a mixing prevention circuit 13 is not connected to the first circuit 11 in the second mixed chip 30 and a mixing prevention circuit 14 is connected to the second circuit 12. Further, as shown in FIG. 7, no mixing prevention circuits are connected to the first circuit 11 and second circuit 12 in the third mixed chip 40.

In the chips with the above configuration, a penetration current is generated in the circuit to which the mixing prevention circuit is connected and no penetration current is generated in the circuit to which the mixing prevention circuit is not connected. Therefore, discrimination between the normal chip 10, first mixed chip 20, second mixed chip 30 and third mixed chip 40 can be made by detecting the presence or absence of the penetration current.

In FIG. 8, the chip discrimination state based on the output signals OUT1, OUT2 is shown. When the output signal OUT1 or OUT2 is "1", it is detected that a penetration current is present, that is, the mixing prevention circuit is installed. Further, when the output signal OUT1 or OUT2 is "0", it is detected that no penetration current is present, that is, the mixing prevention circuit is not installed.

Therefore, as shown in FIG. 8, when the output signals OUT1 and OUT2 output from the chip are both "1", it is determined that the chip is the normal chip 10. When the output signal OUT1 is "1" and the output signal OUT2 is "0", it is determined that the chip is the first mixed chip 20. When the output signal OUT1 is "0" and the output signal OUT2 is "1", it is determined that the chip is the second mixed chip 30. Further, when the output signals OUT1 and OUT2 are both "0", it is determined that the chip is the third mixed chip 40.

As described above, in the third embodiment, a plurality of semiconductor chips can be discriminated by installing a mixing prevention circuit in the same circuit for each of the plurality of semiconductor chips having the same function (the same circuit).

As described above, according to the embodiments of this invention, it becomes possible to provide a mixing prevention circuit which permits semiconductor chips to be correctly discriminated even if the number of products with the same function is increased and in which an influence on the product characteristic is small and the electrical characteristic difference can be easily detected.

Further, the embodiments described above can be independently performed and adequately combined and performed. In addition, inventions of various stages are contained in the embodiments described above and inventions of various stages can be extracted by adequately combining a plurality of constituents disclosed in each of the above embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A mixing prevention circuit comprising:
a first inverter circuit;
a second inverter circuit having an input portion supplied with an output of the first inverter circuit;
a third inverter circuit having an input portion supplied with an output of the second inverter circuit;
a first p-channel MOS transistor and first n-channel MOS transistor whose gates are supplied with an output of the third inverter circuit and whose drains are connected together;
a second p-channel MOS transistor having a gate supplied with the output of the first inverter circuit and a drain connected to a source of the first p-channel MOS transistor;
a third p-channel MOS transistor and second n-channel MOS transistor whose drains are supplied with the output of the first inverter circuit and whose gates are supplied with the output of the third inverter circuit;
a fourth p-channel MOS transistor having a gate connected to the drains of the first p-channel MOS transistor and first n-channel MOS transistor and a drain connected to a source of the third p-channel MOS transistor; and
a third n-channel MOS transistor having a gate connected to the drains of the first p-channel MOS transistor and first n-channel MOS transistor and a drain connected to a source of the second n-channel MOS transistor.

2. The mixing prevention circuit according to claim 1, wherein power supply voltage is applied to the input portion of the first inverter circuit and voltage which varies from reference potential lower than the power supply voltage to the power supply voltage is applied to the output portion of the third inverter circuit.

3. The mixing prevention circuit according to claim 1, wherein power supply voltage is applied to the source of the second p-channel MOS transistor and reference potential lower than the power supply voltage is applied to the source of the first n-channel MOS transistor.

4. The mixing prevention circuit according to claim 3, wherein power supply voltage is applied to the source of the fourth p-channel MOS transistor and reference potential lower than the power supply voltage is applied to the source of the third n-channel MOS transistor.

5. The mixing prevention circuit according to claim 1, wherein each of the first, second and third inverter circuits includes p-channel and n-channel MOS transistors whose drains are connected together.

* * * * *